United States Patent
Mitsuda

(10) Patent No.: US 7,310,025 B2
(45) Date of Patent: Dec. 18, 2007

(54) OSCILLATOR CIRCUIT AND INTEGRATED CIRCUIT INCORPORATING THE SAME

(75) Inventor: Tsuyoshi Mitsuda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/475,009

(22) Filed: Jun. 27, 2006

(65) Prior Publication Data
US 2006/0284692 A1 Dec. 21, 2006

Related U.S. Application Data

(62) Division of application No. 10/950,811, filed on Sep. 28, 2004, now Pat. No. 7,135,937.

(30) Foreign Application Priority Data
Oct. 3, 2003 (JP) .............................. 2003-345642

(51) Int. Cl.
*H02H 7/18* (2006.01)
*H02H 3/08* (2006.01)
(52) U.S. Cl. ................ 331/74; 307/10.7; 361/91.5
(58) Field of Classification Search .................. 331/74; 307/10.7; 361/91.5
See application file for complete search history.

(56) References Cited

U.S. PATENT DOCUMENTS

| | | | |
|---|---|---|---|
| 4,383,188 A | 5/1983 | Crosby | |
| 4,623,851 A | 11/1986 | Abou | |
| 4,623,852 A | 11/1986 | Abou et al. | |
| 4,972,162 A | 11/1990 | Banu | |
| 5,142,162 A * | 8/1992 | Sundeen et al. | ........... 307/10.7 |
| 5,426,384 A | 6/1995 | May | |
| 5,896,070 A | 4/1999 | Tchamov et al. | |
| 6,646,845 B1 * | 11/2003 | Turner et al. | .................. 361/86 |
| 6,803,832 B2 | 10/2004 | Piggot | |
| 2003/0155982 A1 | 8/2003 | Hollinger et al. | |

* cited by examiner

*Primary Examiner*—Benny Lee
*Assistant Examiner*—James Goodley
(74) *Attorney, Agent, or Firm*—McGinn IP Law Group, PLLC

(57) ABSTRACT

The oscillator circuit comprises a capacitor and first to fourth constant current supplies and switches are connected to the capacitor. Both terminals of the capacitor are used for charges and discharges. One period comprises four steps; charging the first terminal of the capacitor, discharging the second terminal, charging the first terminal, and discharging the second terminal.

2 Claims, 4 Drawing Sheets

US 7,310,025 B2

OSCILLATOR CIRCUIT AND INTEGRATED CIRCUIT INCORPORATING THE SAME

The present Application is a Divisional Application of U.S. patent application No. 10/950,811, filed on Sep. 28, 2004 now U.S. Pat. No. 7,135,937.

BACKGROUND OF THE INVENTION

1. Field of the Invention

This invention relates to an oscillator circuit, and, in particular, to an oscillator circuit using charges and discharges of a capacitor, and an integrated circuit incorporating the same.

2. Description of Related Art

Japanese Unexamined Patent Application Publication No. 10-233657 discloses a CR (capacitor-resistor) oscillator circuit using charges and discharges of a capacitor. This oscillator circuit comprises a capacitor and a comparator, wherein one input terminal of the comparator is supplied with a reference voltage and the other input terminal is supplied with the voltage generated by charging and discharging the capacitor, and the comparator outputs the results of the comparison as the oscillation signal. In this circuit, the reference voltage is switched between a lower reference voltage and a higher reference voltage based on the generated oscillation signal. The operation of charging and discharging the capacitor is also controlled based on this oscillation signal.

In the above-mentioned CR oscillator circuit, the period of the oscillation is determined only by the conditions of one terminal of charging and discharging the capacitor. In order to have a longer period with this oscillator circuit, a capacitor with higher capacitance is required. Such a capacitor, however, takes a larger area, which causes the problem of the increasing cost of the chip.

SUMMARY OF THE INVENTION

One of the purposes of this invention is to provide an oscillator circuit which can generate longer period of the oscillation signal without increasing the size of the capacitor, and an integrated circuit incorporating the same.

The oscillator circuit according to this invention features that the oscillation signal is generated by charging and discharging the capacitor via each terminal independently.

In the present invention, a voltage difference between both terminals is generated by charging and discharging the capacitor via each terminal. For example, a constant current applied to one terminal raises the voltage of the one terminal, making the voltage of the one terminal higher than that of the other terminal and increasing the voltage difference between them. Then, a constant current applied to the other terminal decreases the voltage difference between the other terminal and the one terminal. Similarly, a constant current applied to the one terminal lowers the voltage of the one terminal, making the voltage of the one terminal lower than that of the other terminal and increasing the voltage difference between them. Then, a constant current applied to the other terminal decreases the voltage difference between the other terminal and the one terminal. The successive combination of these operations allows a longer period of the oscillation signal to be generated, compared with the case where the voltage of the one terminal of the capacitor is fixed to a constant value and the voltage of the other terminal is raised and lowered by the charges and discharges.

The integrated circuit according to the present invention comprises a driver circuit for driving a load and a control circuit for controlling the driver circuit. The control circuit has an oscillator circuit for generating an oscillation signal by charging and discharging the capacitor via each terminal. The control circuit monitors the current on the load in a given cycle based on the oscillation signal and controls the driver circuit based on the monitoring result. In the present invention, the current on the load such as a lamp or motor of a vehicle is monitored in a given cycle based on the oscillation signal generated by the oscillator circuit having a capacitor that can be charged and discharged via each terminal. It is thereby possible to downsize or eliminate the circuit such as a divider for making the period of the oscillation signal longer even in the case of using a capacitor with small capacitance.

As described above, this invention allows the generation of the longer period of oscillation signal without increasing the size of the capacitor.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

In order to distinguish the above-mentioned and other purposes, features and advantages of this invention, the embodiments of the invention are described in detail below by reference to the drawings.

Figure 1:
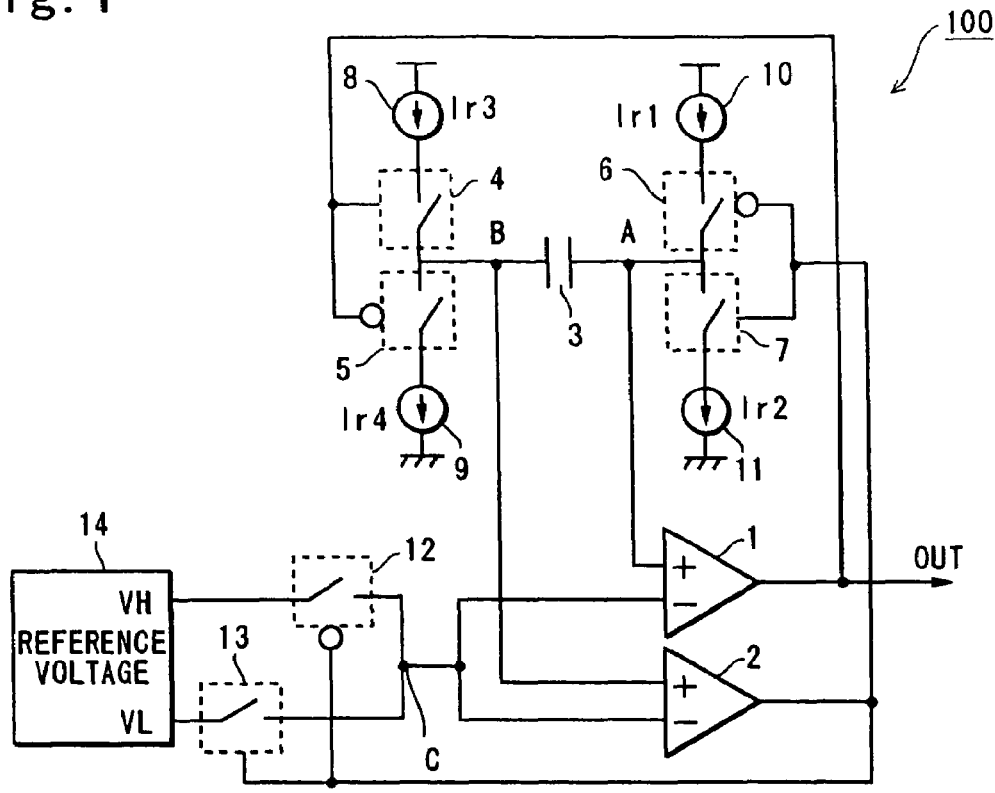
FIG. 1 is a circuit diagram showing an oscillator circuit according to a specific embodiment of the present invention.

FIG. 1 shows one embodiment of this invention.

FIG. 1 illustrates an oscillator circuit 100 according to a specific embodiment of this invention. In the oscillator circuit 100, one (first) terminal A of a capacitor 3 is connected to one input terminal of a first comparator 1. The output of the first comparator 1 is represented as the output signal OUT (oscillation signal). The other (second) terminal B of the capacitor 3 is connected to one input terminal of a second comparator 2. The output signal OUT is supplied to (third and forth) switches 4 and 5.

The switch 4 is composed of, for example, an inverter being supplied with the output signal OUT, and a p-MOS transistor being supplied with the output of the inverter. The switch 5 is composed of, for example, an inverter being supplied with the output signal OUT, and an n-MOS transistor being supplied with the output of the inverter. Both one terminals of the switches 4 and 5 are connected to the second terminal B of the capacitor 3, which is node B. Both the other terminals of the switches 4 and 5 are connected to (second and fourth) current supplies 8 and 9 respectively. The current supply 8 is connected to a first power supply, e.g., Vcc power supply, and supplies constant current Ir3; on the other hand, the current supply 9 is connected to a second power supply, e.g., the ground, and supplies constant current Ir4. The switch 4 is in ON state when the logic level of the output signal OUT is high. The switch 5 is in ON state when the logic level of the output signal OUT is low. The switch 4 may be a transfer gate of p-MOS and n-MOS transistors arranged in parallel between node B and the current supply 8. Also, the switch 5 may be a transfer gate of p-MOS and n-MOS transistors arranged in parallel between node B and the current supply 9.

The output of the comparator 2 is supplied as the control signal for (first and second) switches 6 and 7. The switch 6 is in ON state when the output of the comparator 2 is low level, and is composed of, for example, a p-MOS transistor. The switch 7 is in ON state when the output of the comparator 2 is high level, and is composed of, for example, an n-MOS transistor. Both one terminals of the switches 6 and 7 are connected to the first terminal of the capacitor 3, which is node A. Both the other terminals of the switches 6 and 7 are connected to (first and second) current supplies 10 and 11 respectively. The current supply 10 is connected to the first power supply, e.g., Vcc power supply, and supplies constant current Ir1. The current supply 11 is connected to the second power supply, e.g., the ground, and supplies constant current Ir2. Each of the switches 6 and 7, as well as the switches 4 and 5, may be arranged by transfer gates of p-MOS and n-MOS transistors.

If the switch 6 and the constant current supply 10 connected to the first terminal A of the capacitor 3 constitute a first circuit, the switch 7 and the constant supply 11 constitute a second circuit, the switch 4 and the constant current supply 8 connected to the second terminal B of the capacitor 3 constitute a third circuit, and the switch 5 and the constant current supply 9 constitute a fourth circuit, at least one of the first to fourth circuits may be composed of a resistor, or a switch and a resistor, for example.

Each of the other input terminals of comparators 1 and 2 are connected to node C. Node C is connected to a reference voltage generator 14 via switches 12 and 13. The switch 12 is connected between the terminal of the higher reference voltage of the reference voltage generator 14 and node C. The switch 12 is, for example, composed of a transfer gate, and is in ON state when the logic output level of the comparator 2 is low. The switch 13 is connected between the lower reference voltage terminal of the reference voltage generator 14 and node C. The switch 13 is, for example, composed of a transfer gate, which is in ON state when the logic output level of the comparator 2 is high. The reference voltage generator 14 is a constant voltage supply which generates a higher reference voltage VH and a lower reference voltage VL.

In sum, the oscillator circuit 100 according to this embodiment comprising the capacitor 3, the comparator 1, and a charge/discharge circuit. The comparator 1, as described above, outputs the oscillation signal OUT based on the result of the comparison between the voltage of the first terminal A of the capacitor 3 and the higher reference voltage VH or the lower reference voltage VL. The charge/discharge circuit controls the charging and discharging of the capacitor 3 via each terminal. In this embodiment, the charge/discharge circuit comprising the comparator 2, a first charge/discharge circuit including the switches 6, 7 and the constant current supplies 10, 11, a second charge/discharge circuit including the switches 4, 5 and the constant current supplies 8, 9, and a reference voltage output circuit including the reference voltage generator 14 and the switches 12, 13. The comparator 2 serves as a control circuit to control the charging and discharging of the capacitor 3 by the first charge/discharge circuit. The comparator 1 serves as a control circuit to control the charging and discharging of the capacitor 3 by the second charge/discharge circuit.

Figure 2:
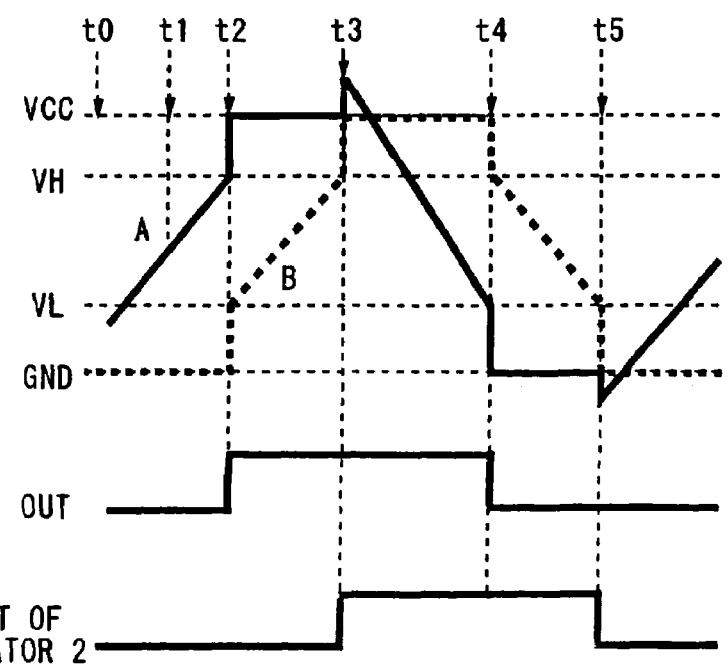
FIG. 2 is a waveform chart showing waveforms of an oscillator circuit according to a specific embodiment of the present invention.

Then, the operation of the oscillator circuit 100 of FIG. 1 is explained below by reference to FIG. 2.

The output signal OUT and the output of the comparator 2 are both low level during t0 to t2. Accordingly, the following state is resulted; the switch 6 is ON, the switch 7 is OFF, the switch 4 is OFF, and the switch 5 is ON. The voltage level of node A increases according to the current Ir1 supplied from the power supply 10 and the time constant of the capacitor 3. The voltage of node B is grounded. At this time, the switch 12 is in ON state and the switch 13 is in OFF state, so that node C is supplied with the higher reference voltage VH. It is noted that the current value from the current supplies 8 to 11 are assumed to be the same value.

The voltage difference between the terminals of the capacitor 3 is increasing, therefore the time period between t0 to t2 is a time period for charge (first charge).

At t2, the voltage of node A reaches VH, allowing the output signal OUT to change to high level. By this change, the switch 5 is turned off and the switch 4 is turned on. During this change, both switches 4 and 5 are in OFF state therefore for a instance resulting in an instant floating state of node B. Accordingly, node A becomes independent of the time constant, so that the voltage of node A is raised to Vcc from VH instantaneously. And, the voltage of node B is raised, for example, to VL due to the coupling effect. Then, the voltage of node B increases.

The voltage difference between the terminals of the capacitor 3 is decreasing, therefore the time period between t2 and t3 is a time period for discharge (first discharge).

At t3, the voltage of node B exceeds VH, allowing the output of the comparator 2 to change from the low level to the high level. By this change, the switch 6 is turned off and the switch 7 is turned on. During this change, a transient state where both switches 6 and 7 are in OFF state occurs. In this state, node A becomes floating, so that the voltage of node B becomes independent of the time constant and the node B is instantaneously charged to Vcc. The voltage of node A transiently exceeds Vcc cause of the coupling effect by which the voltage of node B is raised to Vcc. Then, the switch 7 is turned on and the switch 6 is turned off, which allows the voltage of node A to decrease gradually according to the time constant. On the other hand, by the above change that the output of the comparator 2 changes to high to turned off the switch 12 and to turned on the switch 13. Accordingly, the level of node C is shifted to VL.

The voltage difference between the terminals of the capacitor 3 is increasing, therefore the time period between t3 and t4 is a time period for charge (second charge).

At t4, the voltage of node A reaches VL. Then, the output of the comparator 1 changes from high to low. So that, the switch 5 is turned on and the switch 4 is turned off. During this change, the state of the floating node B occurs, and the voltage of node A drops from VL to the ground. This drop causes, for example, the voltage of node B to ramp down from Vcc to VH. Then, the voltage of node B gradually decreases according to the time constant.

The voltage difference between the terminals of the capacitor 3 is decreasing, therefore the time period between t4 and t5 is a time period for discharge (second discharge).

At t5, the voltage of node B reaches VL and the output of the comparator 2 changes to low level. According to this change of the output of the comparator 2, the switch 6 is turned on and the switch 7 is turned off. During the transition of switches 6 and 7, the floating state of the node A occurs, which causes the voltage of node B to fall from VL to the ground. So that, the voltage of node A falls below the ground level due to the coupling effect.

As described above, in this invention, after the capacitor 3 is charged via the one terminal (node A) with the current Ir1 (during t0-t2), it is discharged via the other terminal (node B) with the current Ir3 (during t2-t3), and then, after the capacitor 3 is charged via the one terminal with the current Ir2 (during t3-t4), it is discharged via the other terminal with current Ir4 (during t4-t5).

Thus, while one terminal of the conventional capacitor is grounded and only the other terminal is used for the charges and discharges, the present invention uses both terminals of the capacitor 3 for the charges and discharges. Therefore, the present invention allows the longer period of the oscillation signal than the conventional art.

In addition, if a longer period had to be obtained with the prior art configuration, the supplied current to the capacitor should be reduced. In this case, the configuration would be susceptible to noises, and it would be difficult to obtain a constant period because of the variation of the supplied current due to the leakage.

Figure 3:
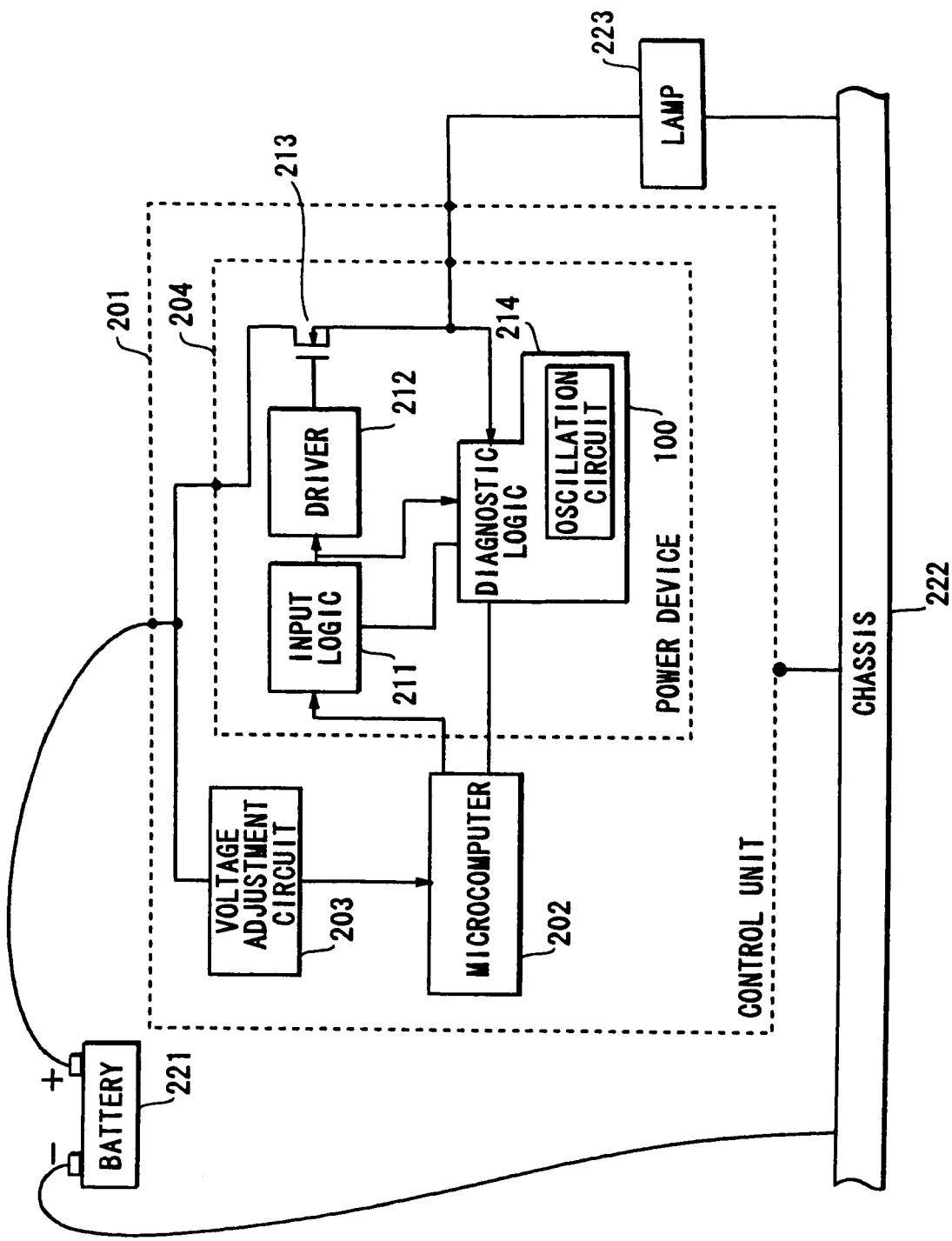
FIG. 3 is a schematic diagram showing a system which incorporates an oscillator circuit according to a specific embodiment of the present invention.

FIG. 3 illustrates a circuit diagram of an example of a system which incorporates the oscillator circuit 100 of this invention. The system exemplified by this embodiment is embedded to automobiles. The system 200 is composed of a control unit 201 including the above-described oscillator circuit 100, a battery 221, a chassis 222, a lamp 223, and so on.

As depicted in FIG. 3, the control unit 201 is connected to the battery 221 and the chassis 222. The control unit 201 comprises a microcomputer 202 that controls the system based on the control signal (not shown), a voltage adjustment circuit 203 that converts 12V-power-supply from the battery 221 into the power supply for the microcomputer 202, and a power device with control function, i.e., IPD (intelligent power device) 204. The power device 204 comprises, for example, an input logic 211 that is supplied with a lamp control signal from the microcomputer 202 for driving the lamp 223, a driver circuit 212 that generates a lamp control signal based on the lamp control signal, and a power MOSFET 213 that drives the lamp 223 based on the lamp control signal. The power device 204 further comprises a diagnostic logic 214 that is supplied with the output of the MOSFET 213 and the lamp control signal, and outputs a diagnostic signal that indicates the anomaly of the lamp 223. The diagnostic logic 214 further comprises the oscillator circuit 100 of the present invention. The power device 204 is, for example, incorporated in an integrated circuit chip.

Figure 4:
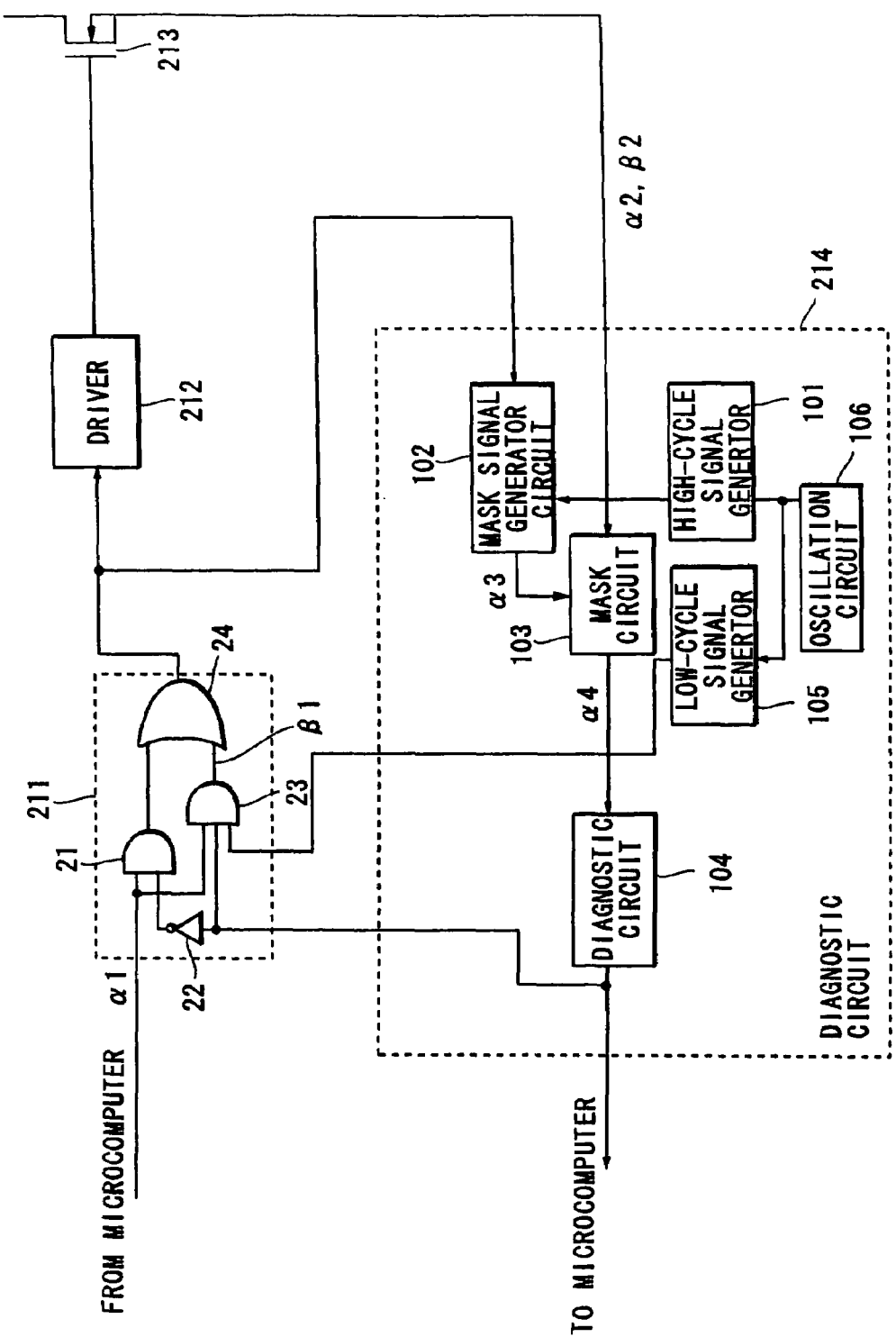
FIG. 4 is a circuit diagram showing each example of the diagnostic logic and the input logic of FIG. 3.
Figure 5:
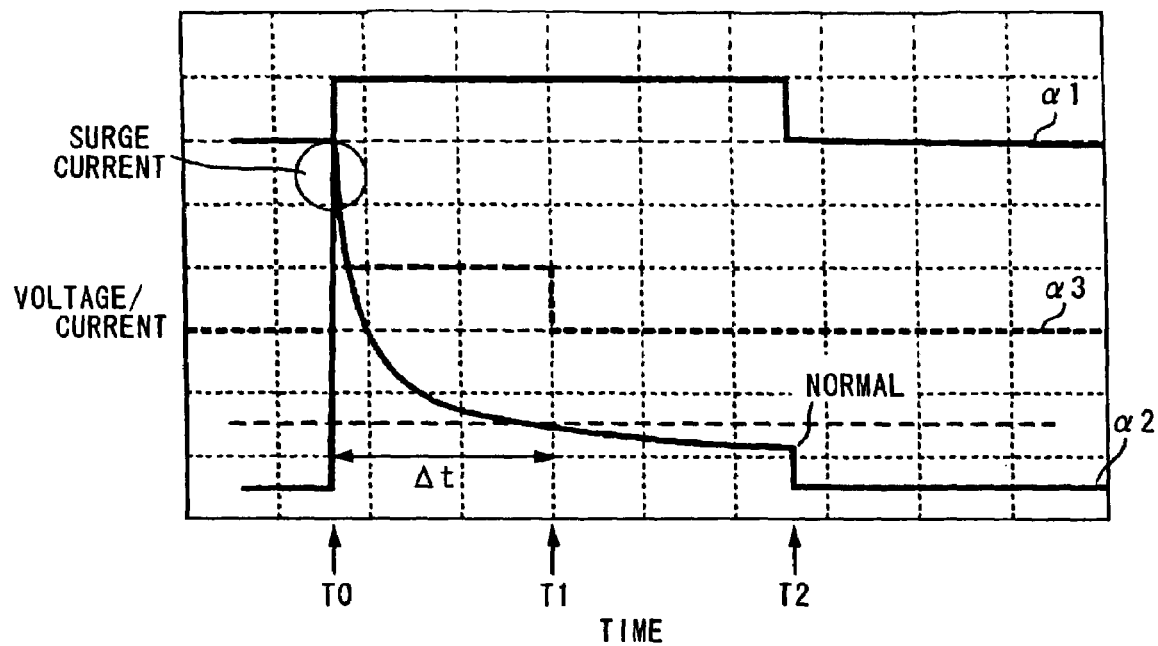
FIG. 5 is a graph showing waveforms related to the operation of the system in FIGS. 3 and 4.

FIG. 4 shows each example of the diagnostic logic 214 and the input logic 211 of FIG. 3. The diagnostic logic 214 comprises a high-cycle signal generator 101 which generates high-cycle signal based on the output of the oscillator circuit 100 of this embodiment. It is not necessary to use the high-cycle generator 101, since it is easy to shorten the oscillation period. For example, the oscillation period can be reduced simply by increasing the current values Ir1, Ir2, Ir3, Ir4 of the constant current supplies 10, 11, 8, 9, respectively, depicted in FIG. 1. The diagnostic logic 214 further comprises a mask signal generator circuit 102 which generates, after the lamp 223 is ignited, an active level mask signal α3 (see FIG. 5) for a few 100 μs to a few ms, for example, based on the high-cycle signal and the lamp control signal α1 from the microcomputer 202. In FIG. 5, the vertical axis for the lamp control signal indicated by α1 and the mask signal indicated by α3 represents voltage values, and that for the lamp current indicated by α2 represents current value.

The diagnostic logic 214 further comprises a mask circuit 103 which is supplied with the mask signal α3 and the current α2 from the lamp 223, and a diagnostic circuit 104 which determines whether the output of the mask circuit 103 is anomaly or not. The mask circuit 103 generates the current α4 in which the lamp current α2 is masked during ΔT from T0 to T1 based on the mask signal α3, and supplies the current α4 to the diagnostic circuit 104. The lamp current α2 consumed in the lamp 223 surges when the current is applied at T0. In order to prevent the microcomputer 202 from detecting the surge current as an error, the mask circuit 103 masks the current α2 until T1 at witch the current is determined as normal. Thus, the diagnostic circuit 104 receives, before T1, the masked current which is masked to be determined as normal current, while receiving, after T1, the actual lamp current α2 on the output terminal which is not masked.

The diagnostic logic 214 comprises a low-cycle signal generator 105, which generates a low-cycle signal of a few 10 ms based on the output of the oscillator circuit 100 of this embodiment. As described above, since the oscillator circuit 100 of this embodiment is capable of generating the oscillation signal with a long period, it is possible to downsize or eliminate the low-cycle signal generator 105 such as a divider. The diagnostic circuit 104 supplies, for example, high level of a signal indicative of an anomaly to the microcomputer 202 when it detects anomaly current during T1 to T2, for instance.

The input logic 211 comprises an AND gate 21, which is supplied with the control signal, which is the lamp control signal α1 in this embodiment, from the microcomputer 202 and an inversed signal, inverted by the inverter 22, of the signal from the diagnostic circuit 104 indicative of an anomaly. The control signal from the microcomputer 202 becomes active, e.g., high when the load such as the lamp 223 is driven, otherwise, becomes low. Accordingly, when the microcomputer 202 drives the lamp 223, the AND gate 21 is supplied with the lamp control signal α1 of high level and the high level signal inverted by the inverter 22 whose input is the output of the diagnostic circuit 104 indicative that the output (current α4) of the mask circuit 103 is normal. At this time, the AND gate 21 outputs high level. On the other hand, the output of the AND gate 23, β1, remains at low level because the output of the diagnostic circuit 104 is low level.

Figure 6:
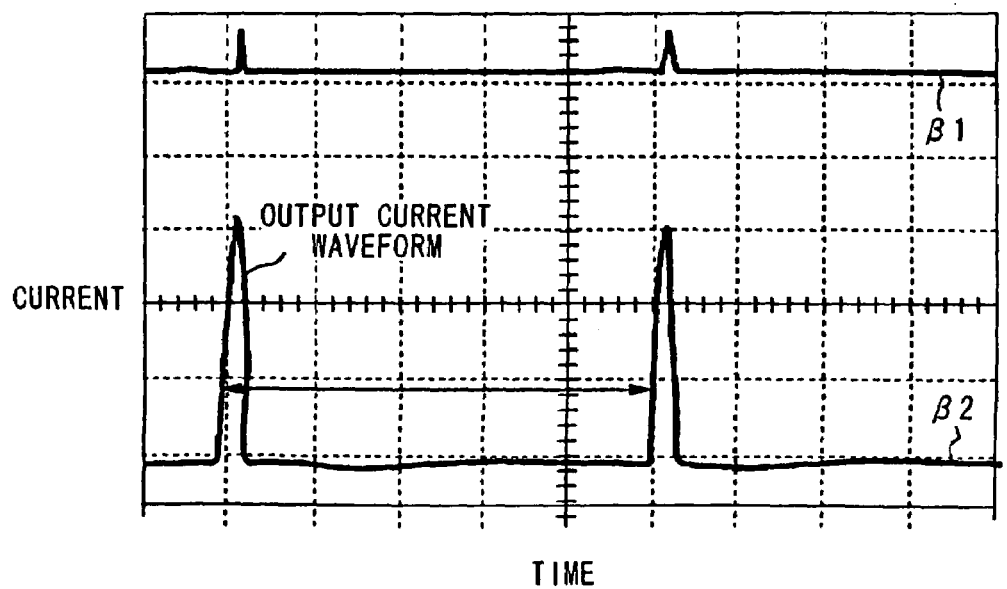
FIG. 6 is a graph showing other waveforms related to the operation of the system in FIGS. 3 and 4.

Next, when the output of the diagnostic circuit 104 indicates an anomaly, the output of the inverter 22 changes to low level, so that the output of the AND gate 21 is fixed to low level. At this time, while the lamp control signal α1 is in high level, the output β1 of the AND gate 23 becomes a pulse signal (see FIG. 6) with the period of, for example, about a few 10 ms which is a response to the low-cycle signal from the low-cycle signal generator 105. An OR gate 24 outputs a logical OR of the outputs of the AND gates 21 and 23. In other words, when the microcomputer 202 drives the load, that is, when the lamp control signal α1 is at high level and a short circuit occurs in the load (the output of the diagnostic circuit 104 is high level), the input logic 211 outputs the low-cycle oscillation signal. The power MOS- FET 213 is driven based on the periodical low pulse signal β1, and the excessive current caused by the short circuit between the output terminal of the power MOSFET 213 and the chassis 222 is periodically monitored in the diagnostic circuit 104. The microcomputer 202 keeps the operation of the low-cycle self-oscillation for a predetermined time. That is, when the signal β2 indicative of an anomaly (see FIG. 6) has been detected for the predetermined time, the microcomputer 202 shuts down the operation of the power device 204 by shifting the level of the lamp control signal α1 to low. If, on the other hand, the state of short circuit is removed within the predetermined time, the output of the diagnostic circuit 104 remains at low level indicative of the normal state, resulting in that the output of the AND gate 21 responses to the output from the microcomputer 202, and the output of the AND gate 23 is forced to be low level. Thus, the system 200 according to this embodiment, even if a transient short circuit occurs, the state of the lamp control signal α1 can be kept for driving the power device 204, and the state of a transient short circuit can be ignored, with the power device 204 being driven.

If, just like conventional oscillator circuit, the supplied current to the capacitor 3 is reduced in order to make the oscillation period longer, it is difficult to obtain a constant period due to noise. Correspondingly, the oscillator circuit 100 of this embodiment is capable of controlling the voltage at both terminals of the capacitor 3. Thus, the oscillator circuit 100 can generate the longer period of oscillation signal compared with the conventional oscillator circuit which controls the voltage at one terminal of the same capacitor. It is thereby possible to downsize or eliminate the low-cycle generator 105 which generates the low-cycle signal for detecting the short circuit in the lamp 223.

It should be noted that this invention is not limited by the above-described embodiments and it is apparent that any alteration for each embodiment is possible within the scope of this invention. For example, while the output OUT of the comparator 1 is used as the oscillation signal in the above described embodiment, the output of the comparator 2 may be used instead. Further, the occurrence of the excessive current is caused by the lamp in the above described embodiment, the load controlled by the microcomputer is not limited to the lamp but may be a motor and so on since the motor as well as the lamp can represent the similar current variation to FIG. 5. In addition, the state of the short circuit can occur not only in the lamp, but also in the other load such as the motor, therefore, it is obvious that the configuration of this invention may be adapted to any other load in parallel.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A controller for controlling a power MOSFET in response to an output of a microcomputer, comprising:
   a driver which responds to an input signal to output a driving signal for driving said power MOSFET;
   a diagnostic logic including:
      an oscillation circuit outputting an oscillation signal;
      a first cycle signal generator generating a first cycle signal based on said oscillation signal;
      a second cycle signal generator generating a second cycle signal based on said oscillation signal;
      a mask circuit producing a masked signal by masking an output signal corresponding to the output of said power MOSFET in response to said first cycle signal and said input signal; and
      a diagnostic circuit generating a diagnostic signal based on said masked signal to be applied to said microcomputer; and
   an input logic producing said input signal based on the output of said microcomputer, said diagnostic signal and said second cycle signal.

2. The controller according to claim 1, wherein the control circuit generates a control signal for masking a current on the load during a predetermined time period based on the oscillation signal and controls the driver circuit by the control signal.

* * * * *